United States Patent [19]

Striny

[11] Patent Number: 4,642,670
[45] Date of Patent: Feb. 10, 1987

[54] CHIP CARRIER PACKAGE
[75] Inventor: Kurt M. Striny, Emmaus, Pa.
[73] Assignee: AT&T Bell Laboratories, Murray Hill, N.J.
[21] Appl. No.: 557,596
[22] Filed: Dec. 2, 1983
[51] Int. Cl.[4] .................. H01L 23/48; H01L 23/30
[52] U.S. Cl. .................................. 357/68; 357/74; 357/72
[58] Field of Search ............... 357/70, 74, 68; 339/17 CF; 174/52 FP

[56] References Cited

U.S. PATENT DOCUMENTS

| | | | |
|---|---|---|---|
| 4,272,140 | 6/1981 | Lychyk et al. | 339/17 CF |
| 4,463,217 | 7/1984 | Orcutt | 174/52 FP |
| 4,495,376 | 1/1985 | Hightower et al. | 357/74 |

FOREIGN PATENT DOCUMENTS

| | | | |
|---|---|---|---|
| 57-162354 | 10/1982 | Japan | 357/70 |
| 58-25247 | 2/1983 | Japan | 357/72 |

*Primary Examiner*—Andrew J. James
*Assistant Examiner*—S. V. Clark
*Attorney, Agent, or Firm*—Peter V. D. Wilde

[57] ABSTRACT

Described is an improved lead design for an integrated circuit chip carrier. The lead incorporates a U- or V-bend in the portion of the lead extending along the edge of the chip carrier to adapt the lead to either surface or socket mounting. The bend can also be used for locking the lead into the socket and, in conjunction with grooves in the sidewall of the chip carrier, for lead alignment retention.

6 Claims, 5 Drawing Figures

U.S. Patent  Feb. 10, 1987  4,642,670
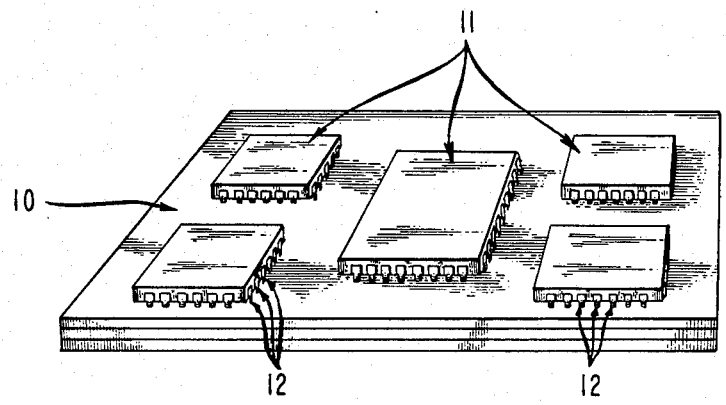
FIG. 1
FIG. 2
(PRIOR ART)
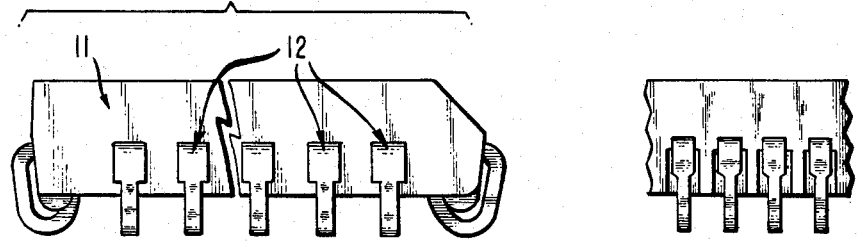
FIG. 4
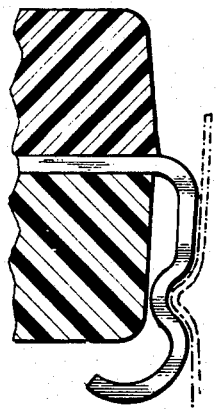
FIG. 3
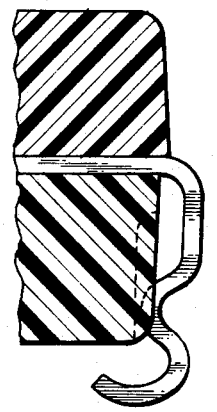
FIG. 5

CHIP CARRIER PACKAGE

BACKGROUND OF THE INVENTION

As semiconductor integrated circuits become more complex a larger number of external electrical connections must be provided to interface with the component level package. Chip packages of the well known dual-in-line type designed for thru hole mounting are inadequate for many new devices. To meet the need for higher and more dense pin-out arrangements the so-called chip carrier package has been developed. A wide variety of chip carrier packages both ceramic and plastic are already available. They are made for surface-mounted and socket assemblies.

BRIEF DESCRIPTION OF THE DRAWINGS

FIG. 1 is a perspective view of a completed component level package containing surface mounted chip carriers;

FIG. 2 is a side view of a conventional chip carrier showing the design of a typical prior art lead;

FIG. 3 is a side view of a chip carrier manufactured in accordance with this invention showing the improved lead design, and showing in phantom a portion of one proposed socket design;

FIG. 4 is an edge-on view of a modified package designed to preserve lead alignment;

FIG. 5 is a side view of the package of FIG. 4.

DETAILED DESCRIPTION

A typical component package assembly is shown in FIG. 1. It includes a mounting board or substrate 10 with chip carrier packages 11 attached as shown. The mounting board may be ceramic or a plastic; e.g. epoxy. Typically it incorporates a circuit pattern on one or more levels of the board for interconnecting leads 12 with other electrical components on the board. The leads 12 may be inserted into sockets in the board or may be bonded (e.g. soldered) to circuit bonding pads on the board. Leads 12, typically of wire ribbon, may occupy one, two, three or four sides of the chip carrier and may be arranged in multiple rows on one or more sides of the chip carrier.

The chip carrier is shown disassembled from the board in FIG. 2. Here the configuration of leads 12 can be seen. The standard configuration is that shown.

This invention is directed to an improved design for leads on a chip carrier. The improved design is shown in FIG. 3. The design of the leads meets an important chip packaging need, and evolved in the following way.

The chip carrier of the circuit package is either shrinking with advances in integrated circuit technology, or staying approximately the same. However the number of leads the package must provide for is growing significantly. Packages with one hundred leads are state of the art. This compares with standard dual-in-line packages (DIP) having e.g. 16 or 32 leads. The leads on packages with high lead counts must be unusually fine to fit in the dimensions available. On the other hand they must be rigid and robust to meet service conditions. Long term reliability of surface mounted (soldered) chip carriers also depends on the compliance of the leads. Rigid leads develop mechanical stresses for a variety of known reasons, e.g. bending of the board in the use environment, differential thermal effects. These stresses cause bond failures. On the other hand, plug-in assemblies require stiff leads. High density lead arrangements require finer lead wires which, for a given material, are more compliant. Again on the other hand is the need for rigidity to prevent bending of the leads during handling prior to assembly. These various opposing requirements have resulted in a choice of compromises for the package designer, none of which are satisfactory.

According to this invention the mechanical performance of the lead is modified by shaping the lead as shown in FIG. 3.

The key feature of this design is the U-shaped bend on the approximately vertical rise of the lead. The U-shaped bend provides a bearing point against the side wall of the molded body. This allows a relatively fine lead wire to be used while preventing large excursions of the lead that could induce permanent deformity. This lead design is thus adapted for either surface mounting or socketing.

We have found in practice that the lead size currently favored for socket mounted parts, which is 10 mils, can if desired be reduced to 8 mls or 6 mils using the teachings of this invention. This reduction in wire size can be important from the standpoint of achievable pin density. Obviously, use of the invention with 10 mil, or even larger leads, is not precluded.

The U-bend also provides, if desired, a means for positively locking the leads into a socket as illustrated in FIG. 3. A portion of the socket, shown in phantom, incorporates a mating protrusion on a spring loaded socket wall member.

A variation of the proposed design is shown in FIG. 4 wherein slots are provided in the sidewall of the package. The depth of the slot is chosen to allow a desired controlled degree of deformation of the lead during socketing. This is useful if the lead wire is to follow closely the end wall of the encased chip at the same time a substantial U-bend is desired. The groove arrangement of FIG. 4 is shown in side view in FIG. 5.

An advantageous aspect of this grooved structure is that each lead may be held captive in its corresponding groove. This restricts lateral excursions of the leads and prevents temporary or permanent bending of the leads. This alignment feature is important for both surface mounted and socket mounted chip carriers.

Various additional modifications and extensions of this invention will become apparent to those skilled in the art. All such variations and deviations which basically rely on the teachings through which this invention has advanced the art are properly considered to be within the spirit and scope of this invention.

What is claimed is:

1. An integrated circuit package comprising an integrated circuit chip encapsulated within a unitary plastic body to form a chip carrier integrated circuit unitary package, a plurality of closely spaced leads arranged along at least one side of the chip carrier at least some of which comprise a wire member extending from the side of the chip carrier unitary package, an approximately right angle bend in the wire member thus providing a portion of the wire member extending approximately vertically downward with respect to the side of the chip carrier unitary package and a U-shaped or V-shaped bend in said portion said bend extending toward the chip side of the chip carrier unitary package so as to provide a bearing point at the base of the U-shaped or V-shaped bend to prevent the approximately vertically extending portion from bearing against the chip carrier unitary package and causing permanent deformation if the wire member is deflected during socketing, handling or the like.

2. The circuit package of claim 1 including a circuit board to which the chip carrier unitary package is attached, with each of said leads soldered to conductive pads on said circuit board.

3. The circuit package of claim 1 including a circuit board to which the chip carrier unitary package is attached, with each of said leads extending into a socket in the board.

4. The circuit package of claim 3 further including means in at least one of said sockets for engaging the U-shaped portion of the lead when the chip carrier unitary package is in place in the board.

5. The circuit package of claim 1 further including a plurality of grooves formed in chip carrier unitary package and positioned so that the U-shaped bend of each of said leads extends into a groove thus preserving the vertical alignment of the lead.

6. The circuit package of claim 1 in which the wire members are no greater than 8 mils in thickness.

* * * * *